United States Patent
Mardi et al.

(10) Patent No.: US 8,659,169 B2
(45) Date of Patent: Feb. 25, 2014

(54) CORNER STRUCTURE FOR IC DIE

(75) Inventors: Mohsen H. Mardi, Saratoga, CA (US); David M. Mahoney, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 142 days.

(21) Appl. No.: 12/891,715

(22) Filed: Sep. 27, 2010

(65) Prior Publication Data

US 2012/0074589 A1   Mar. 29, 2012

(51) Int. Cl.
 *H01L 23/48*   (2006.01)
 *H01L 23/52*   (2006.01)
 *H01L 29/40*   (2006.01)

(52) U.S. Cl.
 USPC   257/778; 257/730; 257/E23.01; 257/E23.141

(58) Field of Classification Search
 USPC   ............ 257/778, E23.01, E23.141, 730
 See application file for complete search history.

(56) References Cited

U.S. PATENT DOCUMENTS

| | | | |
|---|---|---|---|
| 6,049,124 A | 4/2000 | Raiser et al. | |
| 6,094,354 A | 7/2000 | Nakajoh et al. | |
| 6,232,652 B1* | 5/2001 | Matsushima | 257/667 |
| 6,750,552 B1 | 6/2004 | Narayanan | |
| 2005/0051352 A1 | 3/2005 | Aoki | |
| 2006/0072297 A1* | 4/2006 | Goodwin | 361/803 |
| 2010/0025844 A1 | 2/2010 | Yamazaki | |
| 2011/0156033 A1* | 6/2011 | Bintang et al. | 257/48 |

FOREIGN PATENT DOCUMENTS

DE    102 11 729 A1   10/2003
WO    WO 2009/038169   * 3/2009

* cited by examiner

*Primary Examiner* — Hsin-Yi Hsieh
(74) *Attorney, Agent, or Firm* — Scott Hewett; John J. King

(57) ABSTRACT

One or more integrated circuit chips are flip-chip bonded to a first surface of a substrate. A contact array is fabricated on a second surface of the substrate. Corner structures attached to the integrated circuit chip cover at least two corners of the IC chip.

20 Claims, 6 Drawing Sheets

US 8,659,169 B2

CORNER STRUCTURE FOR IC DIE

FIELD OF THE INVENTION

An embodiment of the invention relates generally to integrated circuits, and more particularly corner structures to protect dies of packaged integrated circuits.

BACKGROUND OF THE INVENTION

Many integrated circuit (IC) chips (dies) are with lids that basically enclose the IC chip and often other chips mounted on a package substrate. During electronic testing, force is often applied to the top side of the packaged IC to hold a contact array on the bottom of the package substrate against a test fixture. Depending on the lid design, a package lid can distribute force applied to the topside of the packaged IC around the perimeter of the lid, which avoids force directly on the IC chip and also avoids bowing of the package substrate, which can result in some of the contacts not engaging with the test fixture. If substantial force is necessary to hold the contact array of a non-lidded packaged IC, a die crack or solder fracture might occur.

One approach to avoid die cracking and solder fractures has been to maintain multiple simultaneous forces against the IC die and package substrate during testing. Unfortunately, this complicates the test fixture, especially if other components, such as chip capacitors, are surface-mounted on the package substrate.

Techniques for testing lidless packaged ICs with contact arrays are desirable.

SUMMARY OF THE INVENTION

In one embodiment, an IC includes a substrate, such as a package substrate or silicon interposer, and an IC chip that is flip-chip bonded to a first surface of the substrate. The IC chip has a first corner, a second corner, a third corner and a fourth corner. The substrate has a contact array on a second surface. A first corner structure is attached to the integrated circuit chip and covers at least the first corner. A second corner structure is attached to the integrated circuit chip covering at least the second corner so as to leave a central area of the integrated circuit chip uncovered by the first corner structure and the second corner structure.

In another embodiment, a first IC chip is flip-chip bonded to a first surface of a package substrate, and a second IC chip that is stacked on the first IC chip. A first corner structure is attached to the second IC chip at a first corner having a first footing extending to the first surface of the package substrate. A second corner structure is attached to the second IC chip at a second corner having a second footing extending to the first surface of the package substrate.

In another embodiment, a lidless packaged IC is fabricated by flip-chip bonding one or more IC chips to a first side of a packaging substrate. Corner structures are attached to at least two corners of at least one IC chip. The lidless packaged IC is placed in a test fixture socket of a test fixture. A work press of the test fixture contacts the corner structures of the lidless packaged IC so as to press a contact array on a second side of the packaging substrate against an electrical test contact array of the test fixture.

DETAILED DESCRIPTION OF THE DRAWINGS

Production testing of lidless flip-chip packaged ICs typically involves a work press that presses a contact array (e.g., ball grid array or solder bump array) of the packaged IC into a corresponding bed-of-nails or pogo-pin array of a test fixture. In a conventional test flow, the flip-chip IC is bonded to a larger package substrate and the work press presses against the IC die. Warping or bowing of the package substrate can cause deformation of the IC die that results in electrical or visual failures. An embodiment of the invention includes support structures to one or more corners or edges of the lid-less packaged die(s) so that the work press produces force through the protected corners of the IC die(s), or through the support structures, reducing bowing and its related problems.

Figure 1A:
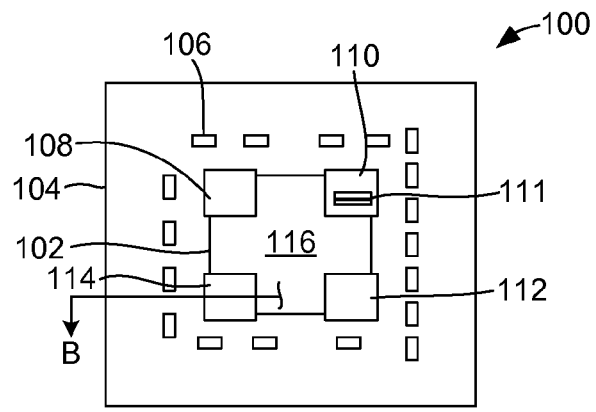
FIG. 1A is a plan view of a packaged IC according to an embodiment.
Figure 1B:
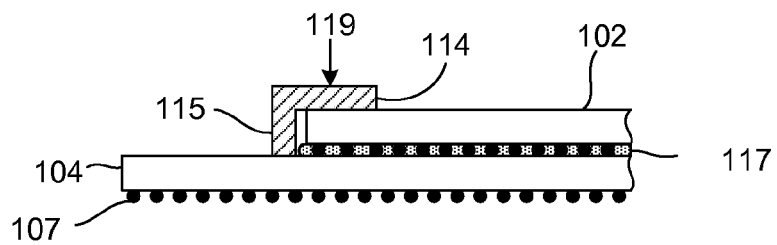
FIG. 1B is a cross section of a portion of the packaged IC of FIG. 1A.

FIG. 1A is a plan view of a packaged IC 100 according to an embodiment. An IC die 102 is flip-chip mounted (bonded) to a package substrate 104. Additional components 106, such as chip capacitors, are optionally mounted to the package substrate surface that the IC die 102 is mounted on. The opposite side of the package substrate has a contact array 107, such as a ball grid array or solder bump array as shown in FIG. 1b. The package substrate 104 is a multi-layer printed wiring board, for example, having one or more layers of patterned metal and vias connecting the contact array of the IC die to corresponding contacts on the bottom of the package substrate. In a particular embodiment, the packaging substrate is a silicon interposer interconnecting multiple IC dies mounted on the silicon interposer or silicon packaging substrate. Similarly, the package substrate connects the components 106 to the IC die or contacts on the bottom of the package substrate.

Rectangular (square) corner structures 108, 110, 112, 114 are attached to the IC die 102. In a particular embodiment, the corner structures are stamped or pressed from copper sheet and attached to the IC die with epoxy or other adhesive. Alternatively, a compressible metallic thermal interface material, such as indium or an alloy of indium, is used to attach copper corner structures. Copper is a desirable material for fabricating corner structures because of its high heat conductivity and relative ductility. Alternatively, corner structures are fabricated from lid material, i.e., the materials used to fabricate conventional lids.

The corner structures 108, 110, 112, 114 cover the corners of the IC die 102 and leave a central area 116 of the IC die 102 uncovered, which can be used for product marking. In an alternative or further embodiment, product marking 111 is placed on the corner structures. In a particular embodiment, a package substrate is about 15 mm by about 15 mm and about 0.69 mm thick; and an IC die is about 5.6 mm by about 9.5 mm and about 0.8 mm (31 mils) thick. The electrical components include surface-mount decoupling capacitors about 0.50 mm high.

FIG. 1B is a cross section of a portion of the packaged IC 100 of FIG. 1A taken along partial section line B. The corner structure 114 includes a footing 115 offset from the side edge of the IC die 102 so that the footing 115 does not impinge underfill material 117, which sometimes extends from the edge of the die. The footing 115 transfers force 119 applied to the top of the corner structure 114 to the packaging substrate 104.

Figure 2:
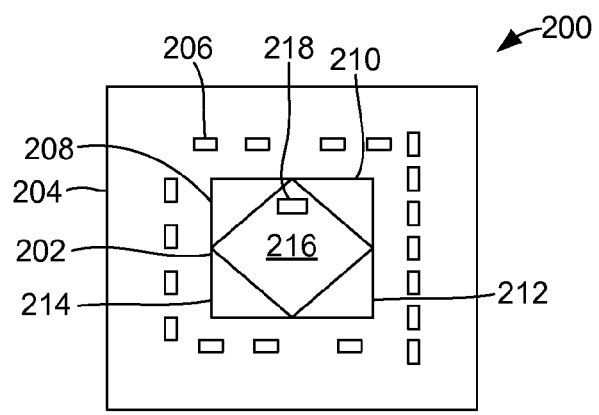
FIG. 2 is a plan view of a packaged IC according to another embodiment.

FIG. 2 is a plan view of a packaged IC 200 according to another embodiment. An IC die 202 is flip-chip mounted (bonded) to a package substrate 204. Additional components 206, such as chip capacitors, are optionally mounted to the package substrate surface that the IC die 202 is mounted on. The opposite side of the package substrate (not shown) has a contact array, such as a ball grid array or solder bump array. Triangular corner structures 208, 210, 212, 214 are mounted on the IC die 202, leaving a central area 216 of the IC die 202 uncovered. In a further embodiment, one or more components 218 such as chip capacitors or another IC die, are mounted on the backside of the IC die and the corner structures are sufficiently thick (i.e., rise to a sufficient height above the IC die 202) so that the workpress does not contact, and possibly crush, the components during testing.

In a particular embodiment, the IC die 202 includes through silicon vias that connect a stacked IC die (e.g., component 218), the through-silicon vias corresponding to a contact array on the stacked die. IC dies with through-silicon vias are often thinner than conventional dies because the wafers from which they are fabricated are backlapped (thinned) to facilitate etching of vias or to expose previously etched vias. Corner structures according to embodiments are particularly desirable for use with thin IC die, such as IC die having through silicon vias.

Figure 3A:
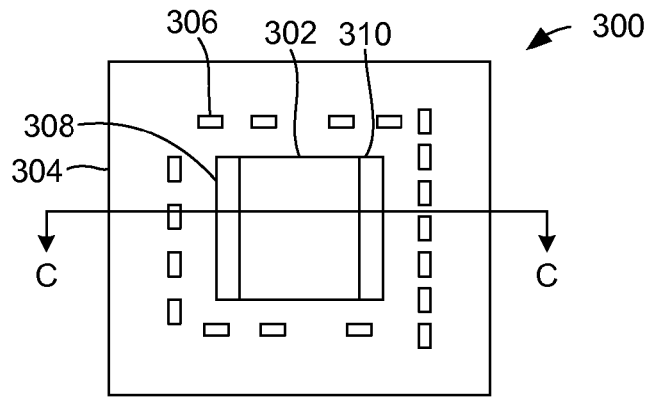
FIG. 3A is a plan view of a packaged IC according to another embodiment.

FIG. 3A is a plan view of a packaged IC 300 according to another embodiment. An IC die 302 is flip-chip mounted (bonded) to a package substrate 304. Additional components 306, such as chip capacitors, are optionally mounted to the package substrate surface that the IC die 302 is mounted on. The opposite side of the package substrate has a contact array (not shown, see FIG. 3B, ref. num. 328), such as a ball grid array or solder bump array. Edge corner structures (i.e., structures that run along an edge to cover one or more corners) 308, 310 are attached to opposite edges of the IC die 302. In one embodiment, the edge contact structures are essentially flat strips (see, FIG. 7). In an alternative embodiment, the edge corner structures are angle members (see, FIG. 3B) or include footings that extend to the package substrate to transfer force from the work press (see generally, FIG. 6) to the package substrate.

Figure 3B:
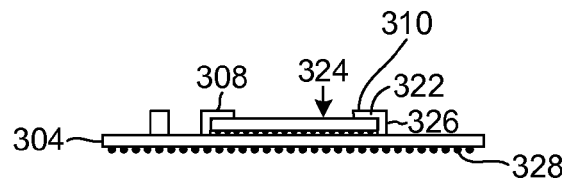
FIG. 3B is a cross section of the packaged IC of FIG. 3A.

FIG. 3B is a cross section of the packaged IC of FIG. 3A taken along section line C-C. The edge corner structures 308, 310 have a first (horizontal) or top portion 322 extending along the backside 324 of the IC die 302 and a footing sidewall portion 326 extending from the top portion. In a particular embodiment, the sidewall portion is a footing extending to the package substrate 304. The top portion 322 transfers force from a work press in a test fixture to the IC die, and the footing portion 326 transfers force from the work press to the package substrate. The force from the work press holds a contact array 328 of the packaged IC in contact with an electrical test bed. In an alternative embodiment, the footing portion does not extend to the package substrate, but provides stiffness to the edge contact structure and additional bonding surface area to the IC die. Alternatively, corner structures with footings (sidewall portions) do not extend all the way to the substrate, which are desirable for applications where contact to the packaging substrate adjacent to the IC die or structures on the surface of the packaging substrate is to be avoided.

Figure 3C:
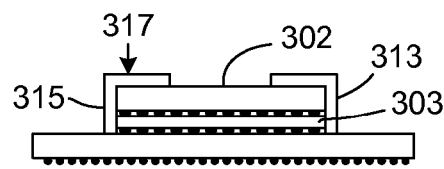
FIG. 3C is a side view of a packaged IC in accordance with FIG. 3A according to a further embodiment.

FIG. 3C is a side view of a packaged IC in accordance with FIG. 3A according to a further embodiment. The rectangular IC die 302 is stacked on an underlying IC die 303. In a particular embodiment, the underlying IC die 303 has the same footprint as the overlying die 302 and includes through-silicon vias (not shown) extending from the active silicon to the backside of the IC die 303. IC die with through-silicon vias are often substantially thinner, and hence more fragile, than IC die without through-silicon vias, as through-silicon vias have a limited aspect ratio, and the wafer on which the ICs with through-silicon vias is often backlapped to allow for finely-spaced vias. The corner structures have footings 313, 315 that transfer force applied to the surface 317 of the corner structure by a workpress during electronic testing of the packaged IC.

Figure 4:
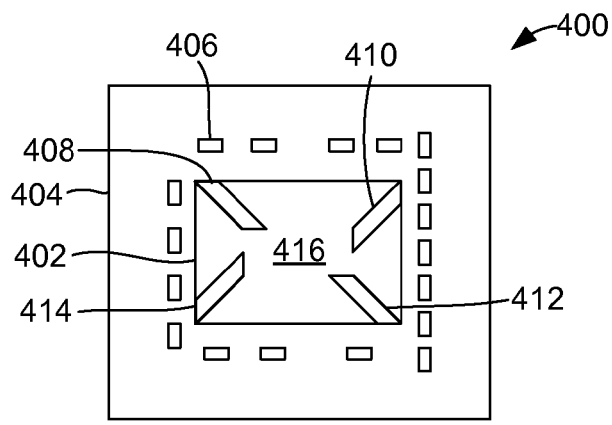
FIG. 4 is a plan view of a packaged IC according to another embodiment.

FIG. 4 is a plan view of a packaged IC 400 according to another embodiment. A rectangular IC die 402 is flip-chip mounted (bonded) to a package substrate 404. Additional components 406, such as chip capacitors or other ICs, are optionally mounted to the package substrate surface that the IC die 402 is mounted on, or on the IC die. The opposite side of the package substrate (not shown) has a contact array, such as a ball grid array or solder bump array. Strip corner structures 408, 410, 412, 414 are mounted on the IC die 402 extending from a corner 409 of the IC die toward a uncovered central area 416 of the IC die. In one embodiment, the strip corner structures include a footing extending to the package substrate. The footings provide additional strength in the Z-direction to couple some of the press force from the corner structure to the package substrate outside of the IC die. An alternative embodiment omits the footings and the press force is transmitted through the IC die to the package substrate.

FIG. 5A is a plan view of a composite packaged IC 500 according to an embodiment. Multiple IC dice 502, 504, 506 are mounted on a first side (top side) and electrically connected to a silicon interposer 508 which in a particular embodiment is a silicon interposer having patterned metal layers on the side interfacing with the IC dice and through-silicon vias (not shown) extending from the patterned metal layers to the opposite side (bottom side) of the interposer. The through-silicon vias are typically bumped (not shown) to form a contact array, such as a ball grid array or a solder bump array on the bottom of the silicon interposer 508 that connects to a corresponding contact array on a package substrate 510 (not shown, as it underlies the interposer). The package substrate 510 typically has layers of patterned metal separated by intervening dielectric material and has another contact array (not shown) on the bottom side (i.e., the side opposite the side that the interposer is mounted on) that is intended to be connected to a corresponding contact array on a printed wiring board or other assembly, or alternatively bonding pads.

Silicon interposers are particularly desirable for use with composite packaged ICs because the thermal expansion characteristics of the silicon interposer matches the thermal expansion characteristics of silicon IC dice. In an alternative embodiment, the packaging substrate is a printed wiring board. The IC dice are, for example, multiple field-programmable gate arrays (FPGAs), an FPGA in combination with processor, ASIC, or memory chips, or multiple FPGAs in combination with processor, ASIC, or memory chips.

Each of the IC dice 502, 504, 506 includes corner structures 510, 512, 514, 516, 518, 520, 522, 524, 526, 528, 530, 532. Alternatively, corner structures are omitted from some of the corners or from some of the dice. Other surface mounted components, such as capacitors, are optionally included in the composite packaged IC 500 but are omitted from FIG. 5 for simplicity of illustration.

FIG. 5B is a cross section of the packaged IC 500 of FIG. 5A taken along section line D-D. Corner structures 514, 516 are on IC die 502, 504, 506 that are mounted on and electrically connected to the silicon interposer 508 with contact arrays 515, which in a particular embodiment are solder bump arrays. The silicon interposer 508 is mounted on and electrically connected to the package substrate 510 with a contact array 509, which in a particular embodiment is a solder bump array or a solder ball array. The package substrate 510 has a contact array 511 on the side opposite the silicon interposer 508 that is used to connect the packaged IC 500 to a printed wiring board or other assembly.

Figure 6:
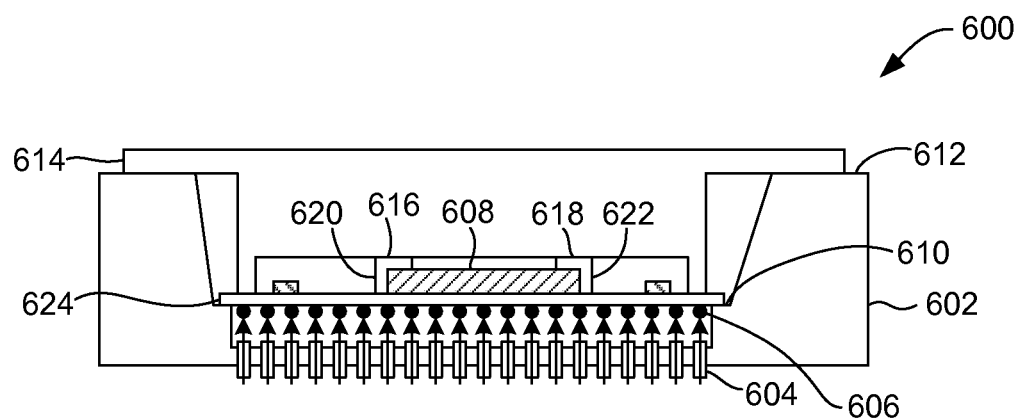
FIG. 6 is a cross section of a test fixture for testing packaged ICs according to an embodiment.

FIG. 6 is a cross section of a test fixture 600 for testing lidless packaged ICs according to an embodiment. The test fixture 600 includes a base 602 with an array of pogo-pin or bed-of-nails type of contacts 604 that correspond to and make electrical contact with the solder balls or other contacts 606 on the bottom of the lidless packaged IC 608. The contacts 604 are connected to an electrical test station (not shown) that provides bias voltages, signals, and measurement interfaces, as is well known in the art of IC test and measurement.

The test fixture 600 has a first stop (gauged surface) 610 that limits how far the lidless packaged IC 608 can be pressed into the contacts (contact elements or contact pins) 604, and a second stop (hard stop) 612 that limits how far the work press 614 can extend toward the base 602. In other words, the base includes a hard stop that limits the travel of the work press. The force between the lidless packaged IC and the work press is controlled so as to not break the IC die and the hard stop is selected to depress the contact pins a selected distance so as to provide reliable electrical contact between the ball array on the package substrate and the contact pins.

The lidless packaged IC 608 includes corner structures according to one or more embodiments 616, 618 with side portions 620, 622 that extend generally from the contact surface of the work press 614 toward the package substrate 624 of the packaged IC. Alternatively, the side portions do not extend all the way to the package substrate. The work press 614 contacts the corner structures 616, 618 and the package substrate 624. In some embodiments, the work press 614 acts as thermal sink that removes heat from the IC die through the edge corner structures 616, 618 during electrical testing. In a particular embodiment, the work press includes a copper block that contacts the top of the die or thermal stability during production testing. Alternatively, a compliant thermally conductive material, such as indium, contacts the IC die in at least one area not covered by the corner structures. The compliant thermally conductive material provides thermal sinking from the IC die during electrical test without adding substantial force to the IC die.

It is desirable to avoid warping of the packaged IC during test because warping can result in unreliable electrical connection at one or more contact pairs (i.e., test pin-contact ball/bump pairs). Excessive warping can also result in the cracking of the IC die or substrate.

Figure 7:
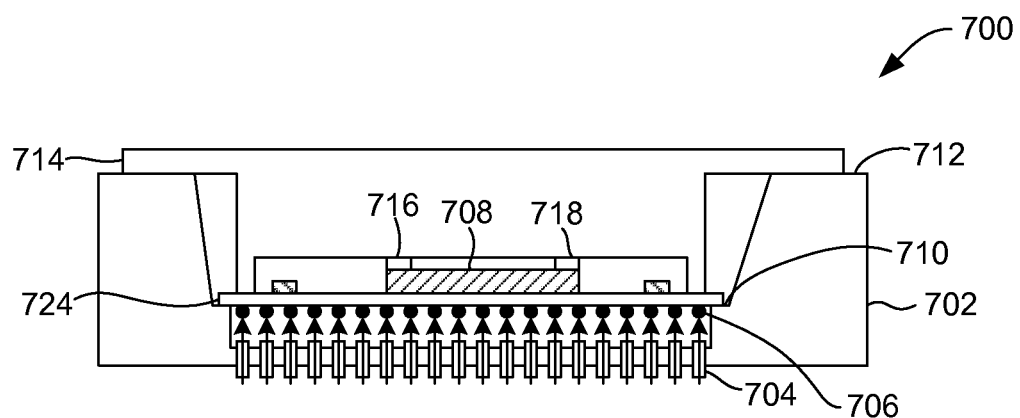
FIG. 7 is a cross section of a test fixture for testing packaged ICs according to another embodiment.

FIG. 7 is a cross section of a test fixture 700 for testing lidless packaged ICs according to another embodiment. The test fixture 700 includes a base 702 with an array of pogo-pin or bed-of-nails type of contacts 704 that correspond to and make electrical contact with the solder balls or other contacts 706 on the bottom of the lidless packaged IC 708. The contacts 704 are connected to an electrical test station (not shown) that provides bias voltages, signals, and measurement interfaces, as is well known in the art of IC test and measurement.

The test fixture 700 has a first stop (gauged surface) 710 that limits how far the lidless packaged IC 708 can be pressed into the contacts 704, and a second stop 712 that limits how far the work press 714 can extend toward the base 702. In other words, the base includes a hard stop that limits the travel of the work press.

The lidless packaged IC 708 includes corner structures according to one or more embodiments 716, 718. The work press 714 contacts the corner structures 716, 618 and the package substrate 724. In some embodiments, the work press 714 acts as thermal sink that removes heat from the IC die through the corner structures 716, 718 during electrical testing. In a particular embodiment, the work press includes a copper block that contacts the top of the die for thermal stability during production testing.

The corner structures provide a surface to make contact with above the die that is distributed and integrated with the packaged IC. The corner structures protect the IC die from damage that can occur with conventional packaged ICs when a die press or other tooling contacts a bare die BGA flip chip package, or other bare die package, or which might occur during handling of the packaged IC. Corner structures according to embodiments also prevent the backside of the die from becoming scratched or damaged with a workpress that might otherwise make direct contact with the die. Such scratches interfere with product marking and also provide a potential initiation site for a crack or other failure due to mechanical strain.

Figure 8:
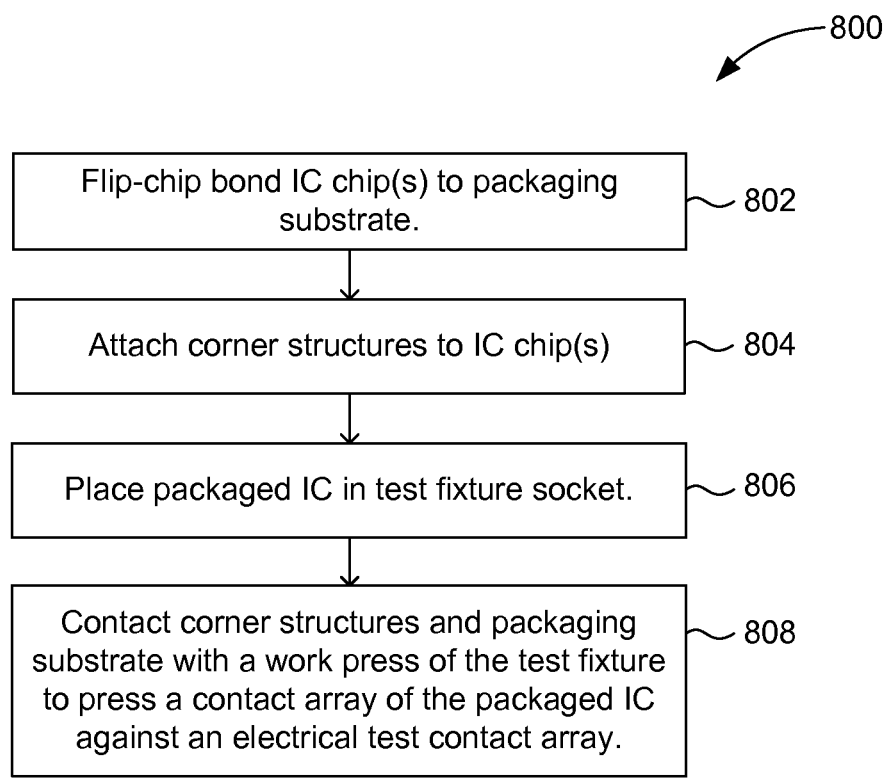
FIG. 8 is a flow chart of a process of fabricating an IC according to an embodiment.

FIG. 8 is a flow chart of a process 800 of fabricating a lidless packaged IC with corner structures according to an embodiment. The process includes steps of assembling the lidless packaged IC (i.e., steps 802 and 804) and of electrically testing the lidless packaged IC (i.e., step 806), which in a particular embodiment is final electrical test. One or more IC chips are flip-chip bonded to a surface of a packaging substrate, which in a particular embodiment is an interposer (step 802). Other components, such as chip capacitors, are optionally bonded to the surface of the packaging substrate. Corner structures are attached to cover the corners of the IC chip (step 804). In a particular embodiment, two edge corner structures cover the four corners of the IC chip. In an alternative embodiment, four corner structures cover the corners of the IC chip. In a multi-chip packaged IC, corner structures cover all corners of all IC chips. In an alternative embodiment, one or more of the corners in a multi-chip packaged IC are not covered with corner structure.

In one embodiment, each corner structure has a footing extending from the corner structure mounted on the surface (backside) of the IC to the surface of the packaging substrate. In an alternative embodiment, none of the corner structures have footings extending to the surface of the packaging substrate. In yet another embodiment, some of the corner structures have footings extending to the surface of the packaging substrate, and some do not.

The packaged IC is placed in an electrical test fixture socket (step 806), and a work press contacts the corner structures and the packaging substrate and presses a contact array on the bottom of the packaged IC against a corresponding array of electrical test contacts of the test fixture (step 808). In a particular embodiment, the test fixture socket includes a first stop to limit the travel of the packaged IC toward the array of electrical test contacts and a second stop to limit the travel of the work press toward the packaged IC.

Figure 5:
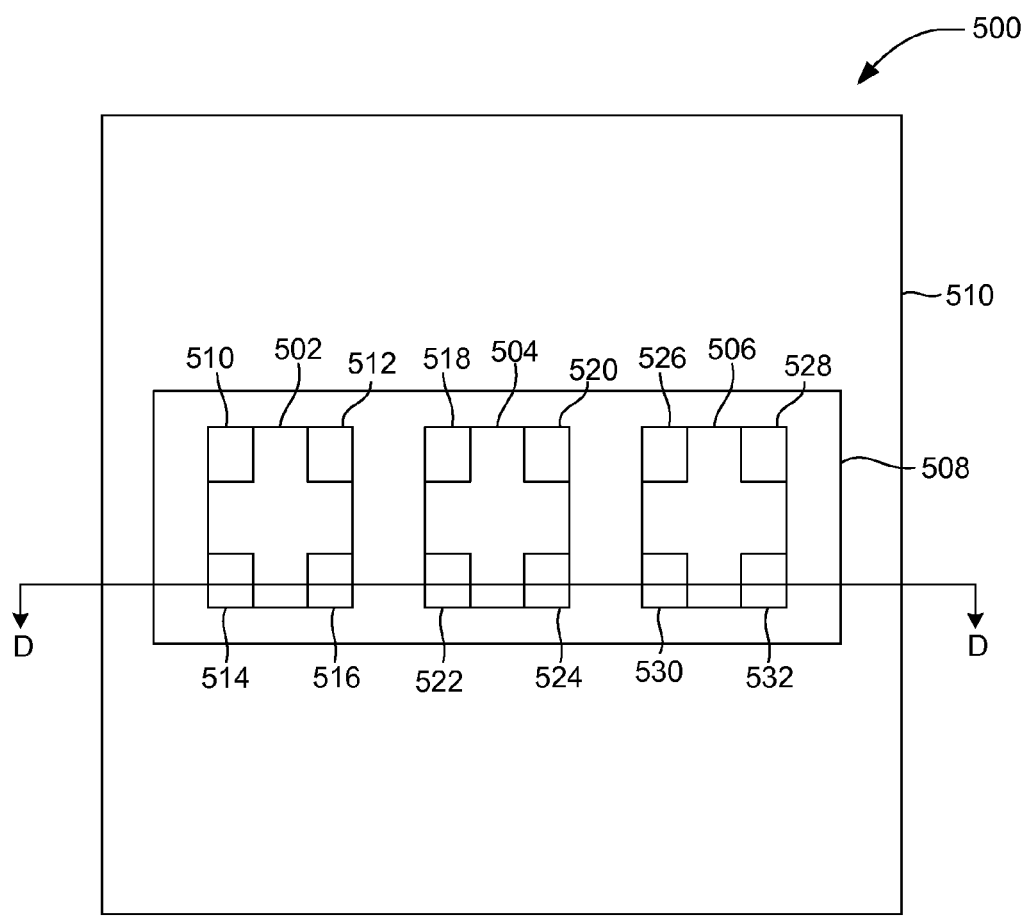
FIG. 5A is a plan view of a composite packaged IC 500 according to an embodiment.
FIG. 5B is a cross section of the packaged IC of FIG. 5A taken along section line D-D.
Figure 5:
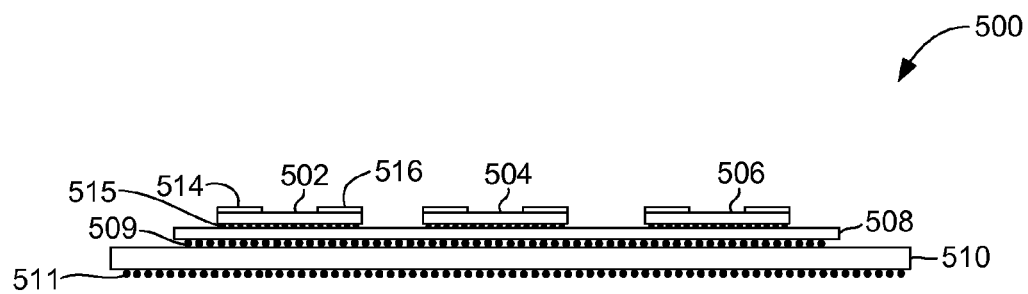
Figure 9:
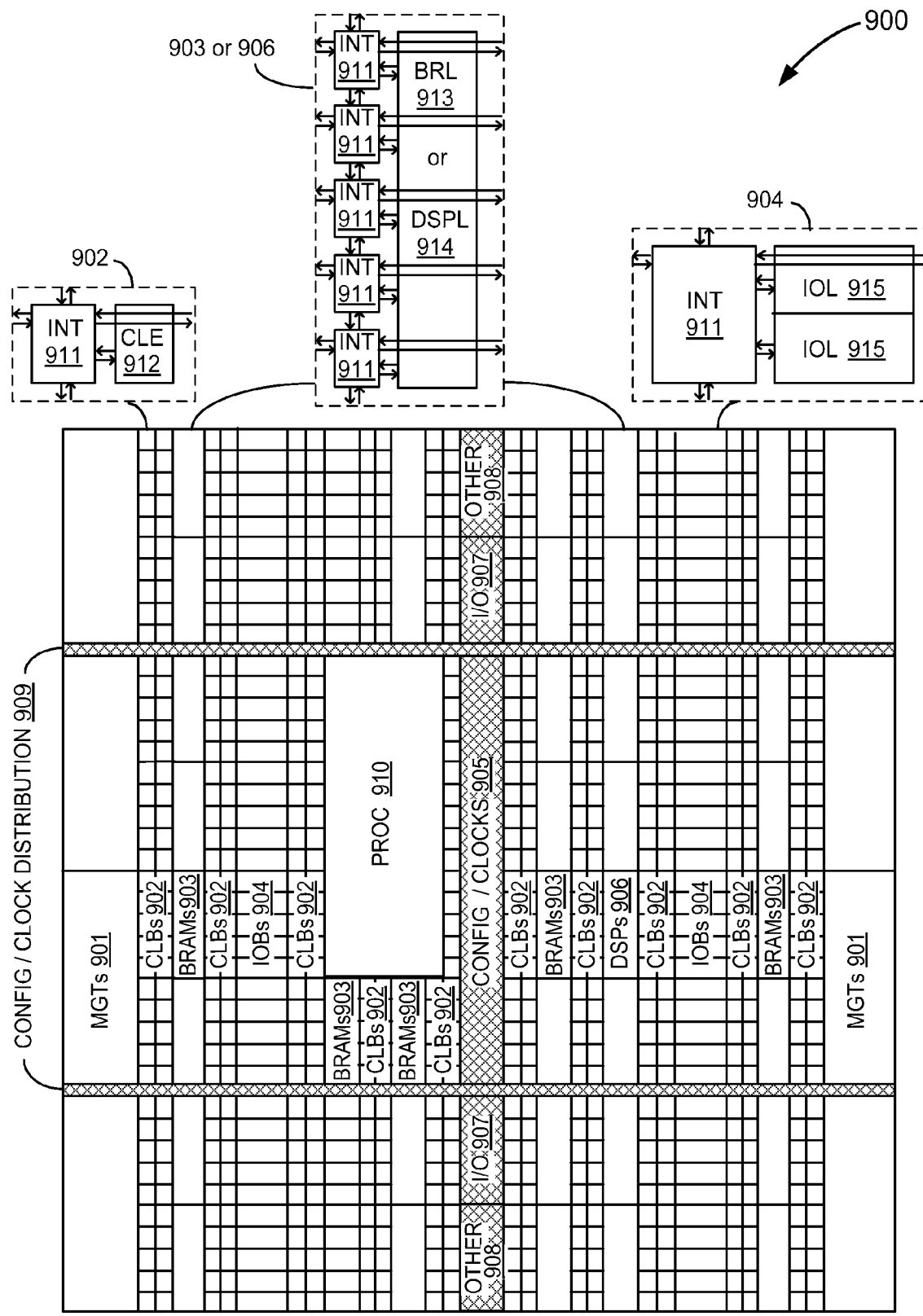
FIG. 9 is a plan view of an FPGA suitable for use with embodiments.

FIG. 9 is a plan view of an FPGA 900 suitable for use with embodiments. For example, one or more of the ICs 502, 504, 506 in FIG. 5 is an FPGA in accordance with FIG. 9. The FPGA is fabricated using a CMOS fabrication process or mixed CMOS/NMOS process.

The FPGA architecture includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing (DSP) blocks 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910. Horizontal areas 909 extending from the CONFIG/CLOCKS 905 column are used to distribute the clocks and configuration signals across the breadth of the FPGA 900.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element (INT) 911 also includes the connections to and from the programmable logic element within the same tile, as shown by the examples included at the top of FIG. 9.

For example, a CLB 902 can include a configurable logic element (CLE) 912 that can be programmed to implement user logic plus a single programmable interconnect element (INT) 911. A BRAM 903 can include a BRAM logic element (BRL) 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element (DSPL) 914 in addition to an appropriate number of programmable interconnect elements. An IOB 904 can include, for example, two instances of an input/output logic element (IOL) 915 in addition to one instance of the programmable interconnect element (INT) 911. Some FPGAs utilizing the architecture illustrated in FIG. 9 include additional logic blocks that disrupt the regular columnar structure making up a large part of the FPGA. The additional logic blocks can be programmable blocks and/or dedicated logic. For example, the processor block PROC 910 shown in FIG. 9 spans several columns of CLBs and BRAMs. PROC 910 may comprise a single power domain or it may comprise multiple power domains or it may share a power domain with other blocks in FPGA 900.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative arrangements of corner structures or configurations of corner structures with alternative footings, posts or sidewalls could be used. Therefore, the spirit and scope of the appended claims should not be limited to the foregoing description.

The invention claimed is:

1. An integrated circuit (IC) comprising:
a substrate;
an integrated circuit chip that is flip-chip bonded to a first surface of the substrate having a first corner, a second corner, a third corner and a fourth corner;
an underfill material on the first surface of the substrate;
a contact array on a second surface of the substrate;
a first corner structure attached to the integrated circuit chip covering at least the first corner, wherein the first corner structure is in direct contact with the substrate and has a first footing which transfers force applied to a top of the first corner structure to the substrate; and
a second corner structure, which is not in direct contact with the first corner structure, attached to the integrated circuit chip covering at least the second corner so as to leave a central area of the integrated circuit chip uncovered by the first corner structure and the second corner structure, wherein the second corner structure is in direct contact with the substrate and has a second footing which transfers force applied to a top of second corner structure to the substrate; and
wherein the first footing and the second footing are offset from a side edge of the IC chip so that the first footing and the second footing do not impinge the underfill material.

2. The IC of claim 1 wherein the first corner structure also covers the third corner and the second corner structure also covers the fourth corner.

3. The IC of claim 2 wherein the first corner structure is a first edge corner structure including a first sidewall portion and the second corner structure is a second edge corner structure including a second sidewall portion.

4. The IC of claim 3 wherein the first sidewall portion and the second sidewall portion each extend to the first surface of the substrate.

5. The IC of claim 1 further comprising product marking on the first corner structure.

6. The IC of claim 1 wherein the integrated circuit chip is a field-programmable gate array and further comprising product marking on the field-programmable gate array.

7. The IC of claim 1 further comprising a third corner structure covering the third corner and a fourth corner structure covering the fourth corner.

8. The IC of claim 7 wherein each of the first corner structure, second corner structure, third corner structure, and fourth corner include one or more sidewall portions.

9. The IC of claim 8 wherein the sidewall portions extend to the first surface of the substrate.

10. The IC of claim 8 further comprising a gap between a sidewall portion and an edge of the integrated circuit chip.

11. The IC of claim 1 further comprising an electrical component mounted on the integrated circuit chip between the first corner structure and the second corner structure.

12. The IC of claim 11 wherein the electrical component is a second integrated circuit chip.

13. The IC of claim 1 wherein the substrate is a silicon interposer and further comprising
a package substrate; and
a second integrated circuit chip that is flip-chip bonded to the first surface of the silicon interposer, the silicon interposer being mounted on the package substrate.

14. The IC of claim 13 further comprising
a third corner structure attached to the integrated circuit chip;
a fourth corner structure attached to the integrated circuit chip;
a fifth corner structure attached to the second integrated circuit chip;
a sixth corner structure attached to the second integrated circuit chip;
a seventh corner structure attached to the second integrated circuit chip; and
an eighth corner structure attached to the second integrated circuit chip.

15. The IC of claim 13 wherein the integrated circuit chip is a first field-programmable gate array and the second integrated circuit chip is a second field-programmable gate array.

16. A method of fabricating a lidless packaged integrated circuit (IC) comprising:
flip-chip bonding an IC chip to a first side of a packaging substrate, the IC chip having a first corner, a second corner, a third corner and a fourth corner;
applying an underfill material on the first side of the packaging substrate;
attaching a first plurality of corner structures to at least two corners of the IC chip, wherein a first corner structure attached to the IC chip covering at least the first corner, wherein the first corner structure is in direct contact with the packaging substrate and has a first footing which transfers force applied to a top of the first corner structure to the substrate and a second corner structure, which is not in direct contact with the first corner structure, attached to the IC chip covering at least the second corner so as to leave a central area of the IC chip uncovered by the first corner structure and the second corner structure, wherein the second corner structure is in direct contact with the packaging substrate and has a second footing which transfers force applied to a top of the second corner structure to the substrate, and the first footing and the second footing are offset from a side edge of the IC chip so that the first footing and the second footing do not impinge the underfill material;
placing the lidless packaged IC in a test fixture socket of a test fixture; and
contacting the first plurality of corner structures of the lidless packaged IC with a work press of the test fixture so as to press a contact array on a second side of the packaging substrate against an electrical test contact array of the test fixture.

17. The method of claim 16 further comprising
flip-chip bonding a second IC chip to the packaging substrate; and
attaching a second plurality of corner structures to the second IC chip, wherein contacting the first plurality of corner structures includes contacting the second plurality of corner structures.

18. The method of claim 16 wherein attaching a first plurality of corner structures to at least two corners of the IC chip comprises attaching a third corner structure covering the third corner and a fourth corner structure covering the fourth corner.

19. The method of claim 18 wherein attaching a first plurality of corner structures to at least two corners of the IC chip comprises attaching the first corner structure, the second corner structure, the third corner structure, and the fourth corner structure having one or more sidewall portions.

20. The method of claim 19 wherein attaching a first plurality of corner structures to at least two corners of the IC chip comprises attaching the first corner structure, the second corner structure, the third corner structure, and the fourth corner structure having one or more sidewall portions which extend to the first side of the packaging substrate.

* * * * *